United States Patent [19]
Lee

[11] Patent Number: 5,761,135
[45] Date of Patent: Jun. 2, 1998

[54] SUB-WORD LINE DRIVERS FOR INTEGRATED CIRCUIT MEMORY DEVICES AND RELATED METHODS

[75] Inventor: Kyu-chan Lee, Seoul, Rep. of Korea

[73] Assignee: Samsung Electronics Co., Ltd., Suwon, Rep. of Korea

[21] Appl. No.: 706,223

[22] Filed: Sep. 3, 1996

[30] Foreign Application Priority Data

Aug. 31, 1995 [KR] Rep. of Korea ............... 1995-28403

[51] Int. Cl.$^6$ ............................................ G11C 7/00
[52] U.S. Cl. .......................... 365/189.11; 365/230.06
[58] Field of Search .................... 365/230.06, 203, 365/189.11

[56] References Cited

U.S. PATENT DOCUMENTS

| | | | |
|---|---|---|---|
| 5,369,619 | 11/1994 | Ohba | 365/230.06 |
| 5,373,471 | 12/1994 | Saeki et al. | 365/200 |
| 5,381,377 | 1/1995 | Bewick et al. | 365/230.06 |
| 5,461,593 | 10/1995 | Kim | 365/189.11 |
| 5,596,542 | 1/1997 | Sugibayashi et al. | 365/230.06 |
| 5,617,369 | 4/1997 | Tomishima et al. | 365/230.06 |

OTHER PUBLICATIONS

Sugibayashi et al., *A 30-ns 256-mb DRAM with a Multidivided Array Structure*, IEEE Journal of Solid–State Circuits, vol. 28, No. 11, Nov. 1993, pp. 1092–1098.

*Primary Examiner*—David C. Nelms
*Assistant Examiner*—Michael T. Tran
*Attorney, Agent, or Firm*—Myers, Bigel, Sibley & Sajovec

[57] ABSTRACT

An integrated circuit memory device includes an array of memory cells arranged into rows and columns. A main word line decoder receives a first portion of a row address and generates a main word line activation signal on a predetermined word line in response thereto. A word driver predecoder receives a second portion of the row address and generates a sub-row activation signal in response thereto. A sub-word line driver generates a sub-word line activation signal on an output node. This sub-word line driver includes a pull-down transistor, a pull-up transistor, and a driving transistor. The pull-down transistor electrically connects the output node to a ground terminal in response to an inverse of the sub-row activation signal. The pull-up transistor transfers the sub-row activation signal to the output node in response to the main word line activation signal. The driving transistor transfers the main word line activation signal to the output node in response to the sub-row activation signal. A sub-word line electrically connects the output node and a predetermined memory cell so that the predetermined memory cell is activated in response to the sub-word line activation signal.

22 Claims, 4 Drawing Sheets

SUB-WORD LINE DRIVERS FOR INTEGRATED CIRCUIT MEMORY DEVICES AND RELATED METHODS

FIELD OF THE INVENTION

The present invention relates to the field of integrated circuits and more particularly to the field of integrated circuit memory devices.

BACKGROUND OF THE INVENTION

A dynamic random access memory (DRAM) includes a plurality of memory cells for storing data and associated peripheral circuits for reading and writing data to and from the memory cells. Each memory cell includes a cell capacitor for storing a charge representative of a data bit and a cell access transistor for controlling the input and output of the charge. FIG. 1 is a block diagram illustrating two memory cells of a dynamic random access memory together with sense amplifiers and a column select gate. FIG. 2 is a timing diagram illustrating a read operation for the device of FIG. 1. The operation of a conventional DRAM will now be discussed with reference to FIGS. 1 and 2.

When a row address strobe signal $\overline{RAS}$ or a column address strobe signal $\overline{CAS}$ is toggled to a logic low level, internal control signals are generated within the memory device. These internal control signals operate in accordance with a predetermined timing in order to perform a desired read operation. In a typical memory device, an address multiplexing method is used to reduce the chip size where an identical address line is controlled by the row address strobe signal and the column address strobe signal. Accordingly, the same address lines are used to input both the row address and the column address for a single read operation.

When a row address A1 is designated, a boosted word line voltage is applied to the word line WLi corresponding to the designated row address. When a column address A2 is designated, the column selection line (CSL) connected to a pair of bit lines corresponding to the designated column address A2 is selected. When the word line WLi for a particular memory cell 2 is selected, the charge from that cell capacitor is distributed to one of a pair of bit lines BLi and $\overline{BLi}$ in a charge sharing operation. Accordingly, a voltage difference is generated between the pair of bit lines.

Sense amplifiers 8 and 10 sense and amplify the voltage difference between the bit lines, and the sense amplifiers may have a P-N latch structure. The sense amplifiers may be shared by adjacent memory cells 2 and 14 in order to reduce a chip size of the memory device. As shown in FIG. 1, the memory cells 2 and 14 may be exclusively selected through use of the isolation gate control signals ISOi and ISOj. As an example, when memory cell 2 is selected, the first control signal ISOi goes to a logic high level by applying the boosting voltage Vpp, thus turning on isolation gates 4 and 6. At the same time, the second control signal ISOj goes to a logic low level such as the ground voltage Vss thus turning isolation gates 16 and 18 off.

By turning the isolation gates 4 and 6 on, a voltage difference is generated between the bit lines BLi and $\overline{BLi}$ in response to a charge stored on the cell capacitor of memory cell 2. This voltage difference may be on the order of several tens of mV to several hundreds of mV. This voltage difference is then amplified by the N-type and P-type sense amplifiers 8 and 10, so that the bit line with the higher voltage is charged to the power supply voltage level Vcc, and the bit line with the lower voltage is discharged to the ground voltage Vss. A column decoder decodes a column address and activates a corresponding column select line to select a respective column select gate 12. Accordingly, the voltages of the bit lines BLi and $\overline{BLi}$ are supplied to the input/output lines IO and $\overline{IO}$ and transferred to output pins of the memory device through a series of output circuits. In this manner, data can be read from individual memory cells.

When the word line WLi is selected, a charge sharing operation is performed between memory cell 2 and the bit line BLi which acts as a parasitic capacitor. If the sense amplifier operates before the charge sharing operation is complete, however, the voltage difference of the bit line pair BLi and $\overline{BLi}$ cannot be sufficiently amplified to the required potential difference thereby increasing the possibility of a malfunction. Accordingly, a sufficient time for the charge sharing operation must be insured, and this time is an important factor in the determination of the access time for the memory device.

In order to reduce the time required to perform the charge sharing operation between a memory cell and its associated bit line, the time required to charge the word line to a predetermined voltage level, such as Vcc+Vt where Vt is a threshold voltage of a memory cell access transistor, may be reduced. In particular, strapping methods have been used to reduce this time.

According to one strapping method, the gate poly used as the control electrode for the access transistor of the memory cell may have a relatively high resistance. To compensate for this resistance, a metal line having a relatively low resistance can be formed over the gate poly. Accordingly, the time required to select the word line is determined by the metal line thus providing an increased transmission speed and increasing the speed of the charge sharing operation.

Such a strapping method may be useful in a DRAM device with relatively large geometries, but this strapping method, however, may not be suitable for use with DRAM devices with relatively small geometries because of manufacturing tolerances. These manufacturing difficulties may result because the metal straps are generally formed on a non-planar surface. Accordingly, for memory devices with over 256 Mb it may be difficult to form a metal line over every word line. In addition, it may be difficult to open a contact hole between the metal and the word line and then to fill this hole with the metal.

Accordingly, there has been proposed a method for making word lines having a hierarchy of structure. This hierarchy of structure is embodied with sub-word lines and sub-word line drivers which are used to designate the sub-word lines. A CMOS sub-word line driver according to the prior art is illustrated in FIG. 3. A main word line MWL is provided for every predetermined number of sub-word lines SWL, and one sub-word line is selected by the combination of the output of block decoder 22 and the main word line MWL. In particular, after the main word line MWL is activated to a logic low level by the main word line decoder 20, the boosting voltage is supplied from the block decoder 22 to the sub-word line SWLi or SWLj via PMOS transistor 30 or 34 of the CMOS sub-word line driver. Because a main word line MWL is not required for each sub-word line, the main word line can be manufactured with sufficient space to provide a metal line thereon.

The CMOS sub-word line driver, however, uses PMOS transistors which require an N-type well formed on a P-type substrate thus lowering the density of the memory device. One approach to this problem has been discussed in the reference by Tadahiko Sugibayashi et al., entitled "A 30-ns 256-Mb DRAM with a Multidivided Array Structure", IEEE Journal of Solid-State Circuits, Vol. 28, No. 11, November 1993, pp. 1092-1098 (NEC Co., Japan). In this reference, a sub-word line driver having only NMOS transistors is discussed.

FIG. 4 illustrates a circuit diagram of the sub-word line driver discussed in the Tadahiko Sugibayashi et al. reference. In particular, when the row address strobe signal goes to the logic low level, a main word line decoder 60 decodes a first portion Ai of the row address, and a word driver predecoder 80 decodes a second portion Ai of the row address. In addition, a node a of the sub-word decoder 100 is precharged to the $V_{BOOST}-V_{TN}$ voltage level by the main word line decoder 60. If one of the lines $RA_{i-l}$ is then selected by the word driver predecoder 80, a respective sub-word line SWLi-j is selected.

The main word line, however, may be difficult to charge to the desired boosting voltage level $V_{BOOST}$ in the power-up and stand-by states. In particular, the boosting voltage level $V_{BOOST}$ is clamped to a predetermined voltage level upon the power-up of the device. When in a stand-by state, the main word line MWL should be maintained at a ground voltage level Vss and the complementary main word line $\overline{MWL}$ should be maintained at the boosting level voltage $V_{BOOST}$. In a 16 Mb DRAM, the load of the signal lines may be on the order of about 6 nF. With a 256 Mb DRAM, however, the load of the signal lines may increase to several tens of nF. Accordingly, it may be difficult to charge up the main word line to a desirable boosting voltage level $V_{BOOT}$ during the power-up and stand-by states in a 256 Mb DRAM.

Furthermore, the stand-by current may increase if a micro bridge occurs. As shown in FIG. 4, a pair of main word lines MW and $\overline{MW}$ are charged with opposite voltage potentials and run parallel to one another. In the stand-by state, the main word line MW, stays at the ground voltage level Vss and the complementary main word line $\overline{MW}$ stays at the boosting voltage level $V_{BOOST}$. Accordingly, if a micro bridge occurs between these two lines, a current path is formed from the boosting voltage level $V_{BOOST}$ to the ground voltage level Vss, thus draining the boosting voltage level $V_{BOOST}$.

When the boosting voltage level is drained, circuits within the memory device such as the oscillator and a sensing circuit may operate continuously to restore the boosting voltage $V_{BOOST}$ to its original level. This continuous operation may cause an increase in the stand-by current, and this increased stand-by current may remain even if the function of the shorted word lines is replaced by redundant word lines. Furthermore, in highly integrated memory devices with relatively small geometries, a micro bridge may be more likely to occur. The increased stand-by current caused by such a micro bridge may affect an increased failure rate of the memory device.

SUMMARY OF THE INVENTION

It is therefore an object of the present invention to provide improved integrated circuit memory devices and methods.

It is another object of the present invention to provide integrated circuit memory devices and methods with increased tolerance for microbridging.

It is still another object of the present invention to provide integrated circuit memory devices and methods having increased production yields.

These and other objects are provided according to the present invention by integrated circuit memory devices and operation methods including an array of memory cells arranged into rows and columns, a main word line decoder, a word driver predecoder, and a sub-word line driver. The main word line decoder receives a first portion of a row address and generates a main word line activation signal on a predetermined word line in response thereto. The word driver predecoder receives a second portion of the row address and generates a sub-row activation signal in response thereto. The sub-word line driver generates a sub-word line activation signal on an output node, and a sub-word line electrically connects the output node and a predetermined memory cell so that the predetermined memory cell is activated in response to the sub-word line activation signal.

More particularly, the sub-word line driver includes a pull-down transistor which electrically connects the output node to a ground terminal in response to an inverse of the sub-row activation signal. A pull-up transistor transfers the sub-row activation signal to the output node in response to the main word line activation signal. A driving transistor transfers the main word line activation signal to the output node in response to the sub-row activation signal. Accordingly, there is no need for an inverse main word line running parallel to the main word line, thus reducing the potential for a short between the ground voltage and the boosting voltage. The power consumption of the memory device using the sub-word line driver of the present invention can thus reduce the current consumed when in the stand-by and power-up states.

The sub-word line driver can also include a precharge transistor which transfers the main word line activation signal to a gate of the pull-up transistor in response to a predetermined boost voltage. This predetermined boost voltage can be higher than an internal supply voltage. Furthermore, each of the pull-down transistor, the pull-up transistor, the precharge transistor, and the driving transistor, can be an NMOS transistor. Accordingly, the need for N-type wells for a CMOS structure can be eliminated thus increasing the circuit density of the memory device.

More particularly, the precharge transistor includes a drain electrically connected to the predetermined word line, a source electrically connected to the gate of the pull-up transistor, and a gate which is driven by the predetermined boost voltage. The pull-up transistor can include a drain which receives the sub-row activation signal, a source electrically connected to the output node, and a gate electrically connected to the source of the precharge transistor. The pull-down transistor can include a drain electrically connected to the output node, a source electrically connected to a ground terminal, and a gate which receives the inverse of the sub-row activation signal. The driving transistor can include a drain electrically connected to the predetermined word line, a source electrically connected to the output node, and a gate which receives the sub-row activation signal. In addition, the sub-word line can electrically connect the output node with a second predetermined memory cell so that first and second predetermined memory cells are activated in response to the sub-word line activation signal.

According to another aspect of the present invention, a method for generating a sub-word line activation signal is provided. The memory device has an array of memory cells arranged into rows and columns, a main word line decoder which receives a first portion of a row address and generates a main word line activation signal on a predetermined word line in response thereto, and a word driver predecoder which receives a second portion of the row address and generates a sub-row activation signal in response thereto.

This method includes the steps of electrically connecting an activation node of a predetermined memory cell to a ground terminal in response to an inverse of the sub-row activation signal, and transferring the sub-row activation signal to the activation node in response to the main word line activation signal. The main word line activation signal is then transferred to the activation node in response to the sub-row activation signal so that the predetermined memory cell is activated in response to the sub-word line activation signal.

The activation node can be shared with a second predetermined memory cell so that the first and second predetermined memory cells are activated in response to the sub-word line activation signal. In addition, the word driver predecoder can generate first and second sub-row activation signals in response to the second portion of the row address. When the second sub-row activation signal is generated, a second activation node of a second predetermined memory cell can be electrically connected to a ground terminal in response to an inverse of the second sub-row activation signal. Furthermore, the second sub-row activation signal can be transferred to the second activation node in response to the main word line activation signal, and the main word line activation signal can be transferred to the second activation node in response to the second sub-row activation signal. Accordingly, the second predetermined memory cell can be activated in response to the second sub-word line activation signal.

An integrated circuit memory device including the sub-word line driver of the present invention can thus operate with reduced current consumption in the stand-by state while providing increased memory access speed.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
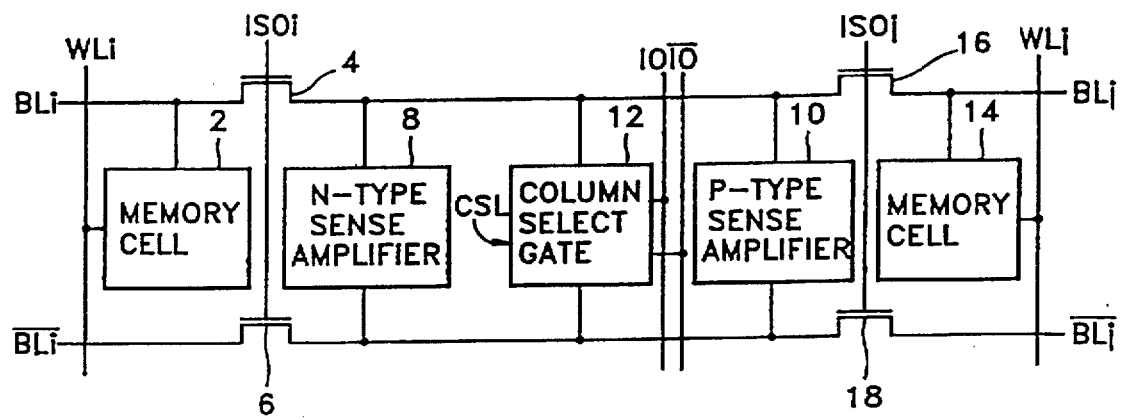
FIG. 1 is a block diagram illustrating two memory cells and associated peripheral circuits for an integrated circuit memory device according to the prior art.
Figure 2:
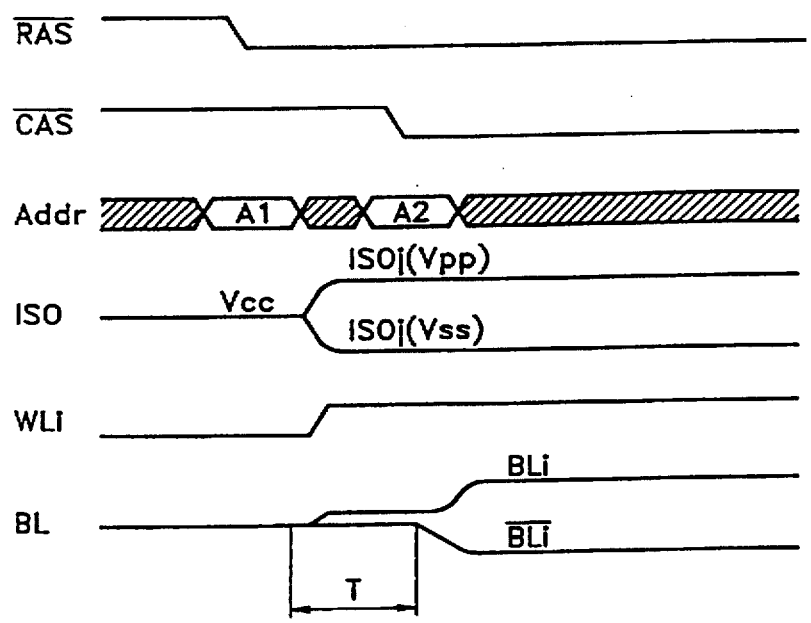
FIG. 2 is a timing diagram illustrating a read operation for the integrated circuit memory device of FIG. 1.
Figure 3:
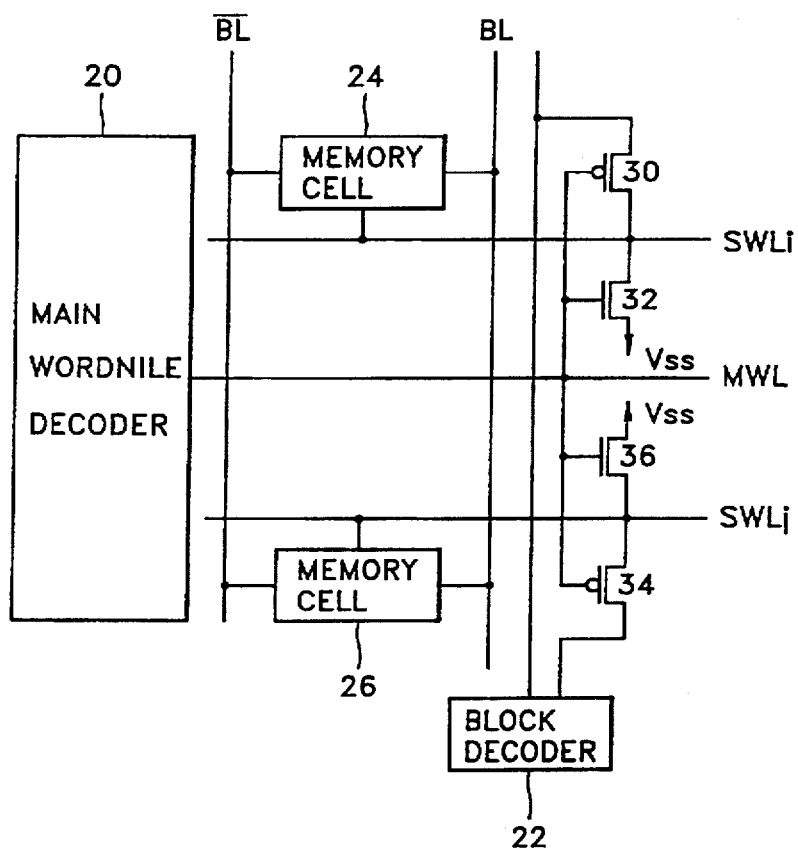
FIG. 3 is a circuit diagram illustrating a CMOS sub-word line driver according to the prior art.
Figure 4:
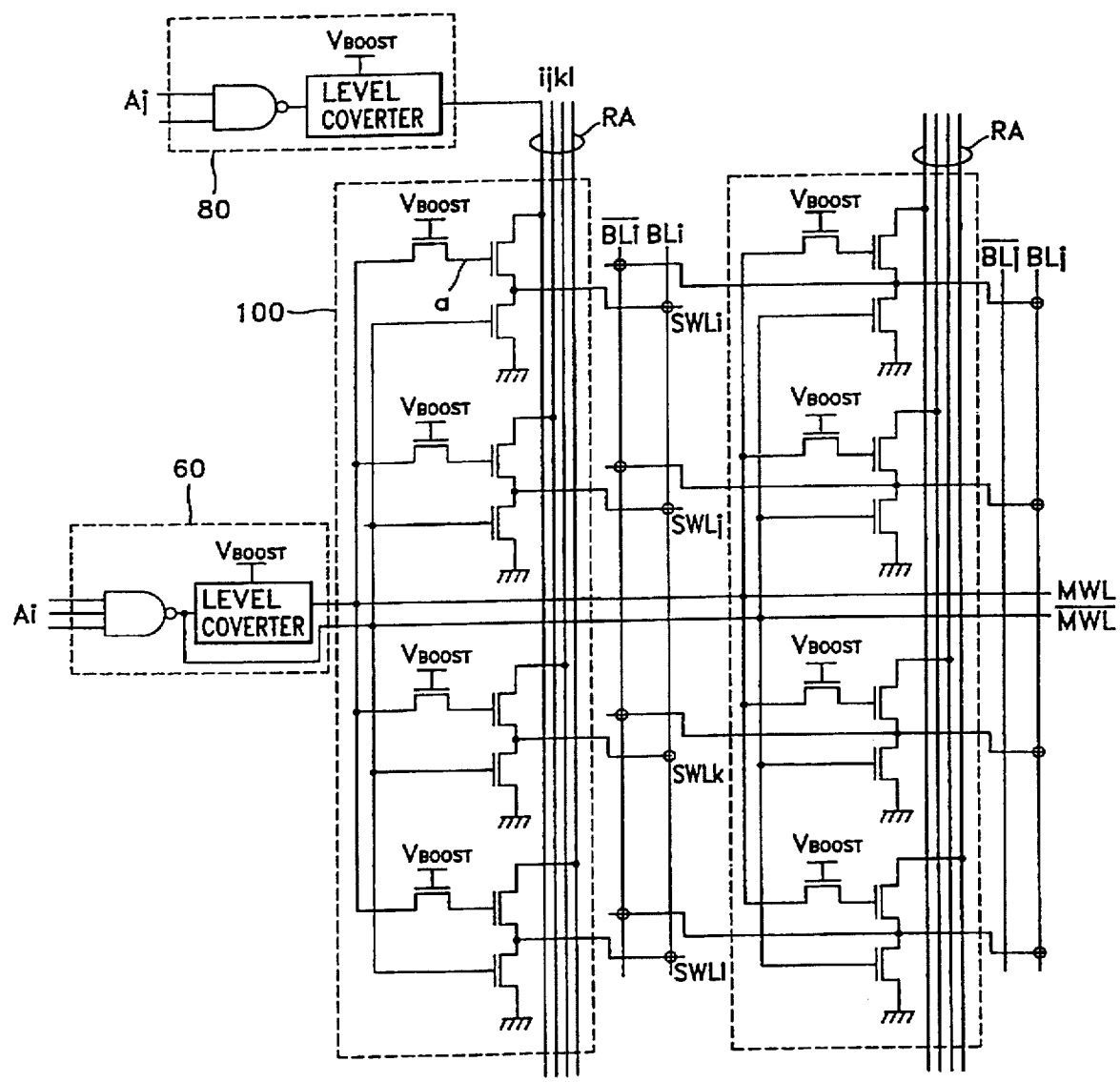
FIG. 4 is a circuit diagram illustrating an NMOS sub-word line driver according to the prior art.
Figure 5:
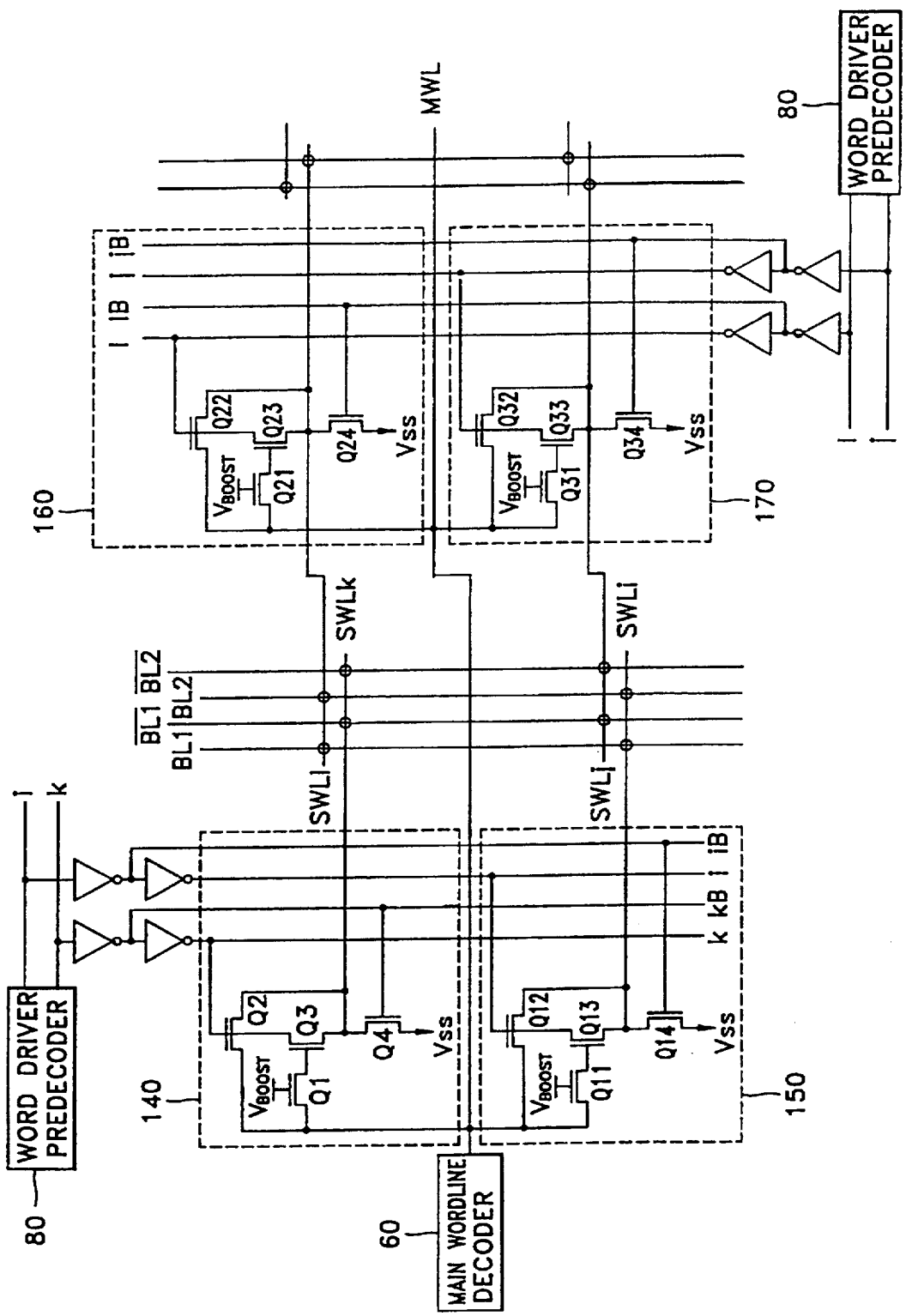
FIG. 5 is a circuit diagram illustrating a sub-word line decoder according to the present invention.

Referring to FIG. 5, a sub-word line decoder includes a main word line decoder 60, a word driver predecoder 80, and sub-word line drivers 140, 150, 160, and 170. The main word line decoder 60 includes a level converter and circuitry for decoding a first portion Ai of a row address, and this main word line decoder is connected to the main word line MWL. The word driver predecoder 80 includes a level converter and circuitry for decoding a second portion Aj of the row address, and this word driver predecoder is connected to predecoded address lines i, j, k, and l.

The sub-word line driver 150 includes a pull-down transistor Q14, a pull-up transistor Q13, a precharge transistor Q11, and a driving transistor Q12. The pull-down transistor Q14 includes a drain connected to a sub-word line SWLi, a source connected to the ground terminal Vss, and a gate connected to the output line iB which carries the inverse of the signal on the predecoded address line i. The pull-up transistor Q13 includes a source connected to the sub-word line SWLi, a drain connected to the output line i which carries the signal of the predecoded address line i, and a gate which is connected to the source of the precharge transistor Q11. The precharge transistor Q11 includes a drain which is connected to the main word line MWL, a source which is connected to the gate of the pull-up transistor Q13, and a gate which is connected to the boosting voltage $V_{BOOST}$. The driving transistor Q12 includes a drain which is connected to the main word line MWL, a source which is connected to the sub-word line SWLi, and a gate which is connected to the output line i which carries the signal of the predecoded address line i.

The sub-word line drivers 140, 160, and 170 have the same structure as the sub-word line driver 150 discussed above with the exception that each sub-word line driver is driven by a different predecoded address line. The combination of sub-word line drivers 140, 150, 160, and 170 make up a sub-word line decoder, and each sub-word line decoder is sequentially connected to each of the word lines. The operation of the sub-word line decoder of FIG. 5 will now be discussed.

When a row address strobe signal $\overline{RAS}$ is maintained at a high logic state, the integrated circuit memory device operates in a stand-by mode where the main word line decoder 60 generates an output signal on the main word line MWL having a low logic state such as the ground potential Vss. When the row address strobe signal $\overline{RAS}$ is toggled to the low logic state, the integrated circuit memory device is activated and a row address is latched in a row address buffer. A first portion Ai of the row address is decoded by the main word line decoder 60, and the decoded signal is applied to the level converter and the boosting voltage $V_{BOOST}$ is in turn applied to the appropriate main word line MWL.

The word driver predecoder 80 decodes a second portion Aj of the row address, such as the two lowest bits of the row address, and applies the boosting voltage $V_{BOOST}$ to the appropriate predecoded address line i, j, k, or l. For the purposes of discussing the operation of the sub-word line driver, an address is chosen such that the boosting voltage $V_{BOOST}$ is applied to the predecoded address line i, and that the boosting voltage $V_{BOOST}$ is applied to the illustrated main word line MWL.

One of the sub-word lines SWLi–l is then activated as discussed below. Only one of the predecoded address lines i–l is driven to the high logic level at a time, and the other predecoded address lines are maintained at the low logic level. For this example, a row address is used so that the predecoded address line i is driven to the high logic state while the predecoded address lines j–l are maintained at the low logic state. Accordingly, the sub-word line SWLi will be driven to the high logic state by the sub-word line decoder 150, while the sub-word lines SWLj–l are maintained at the low logic state. In this situation, the pull-down transistor Q14 is inactive (turned off), while the pull-down transistors Q4, Q24, and Q34 are activated (turned on). Accordingly, the sub-word lines SWLj–l are discharged to the ground terminal Vss.

The pull-up transistor Q13 of the sub-word line driver 150 receives a precharge voltage at its gate from the precharge transistor Q11 when the main word line MWL is driven to the boosting voltage $V_{BOOST}$. This precharge voltage has a magnitude of $V_{BOOST}-V_{TN}$ where $V_{TN}$ is the threshold voltage of the precharge transistor. Accordingly, a signal from the output line i is transferred through the pull-up transistor Q13 to the sub-word line SWLi. The boosting voltage $V_{BOOST}$ is supplied from the main word line MWL to the sub-word line SWLi through the driving transistor Q12 when the output line i is driven to the high logic state.

After each sub-word line activation operation is performed, a charge sharing operation can occur between a memory cell capacitor and a bit line. A voltage difference between the bit lines can be sensed and amplified by bit-line sense amplifier, and this difference can be amplified to generate the potential difference between the bit lines having a CMOS level. The output of the bit line sense amplifier can then be transferred to an input/output line through a column select gate. This output can then be passed through a series of data path control circuits as will be understood by one having skill in the art.

In integrated circuit memory devices of the present invention, when the main word line is held at the logic low level (Vss) such as in the stand-by mode, the number of lines charged to the boosting voltage level can be reduced. Accordingly, the boosting voltage level $V_{BOOST}$ can be more easily maintained during power-up and stand-by operations. Because there is no inverse word line running adjacent the main word line, the occurrence of microbridges can be reduced. In addition, even if a microbridge does occur, its impact during power-up and stand-by operations can be reduced because the main word line is maintained at the ground potential Vss during these operations. Furthermore, if a microbridge occurs, the potential discharge path can be eliminated by replacing the word line with a redundant word line. Accordingly, device failures caused by microbridging can be reduced to thereby enhance the yield of the integrated circuit memory device.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device comprising:
   an array of memory cells arranged into rows and columns;
   a main word line decoder which receives a first portion of a row address and generates a main word line activation signal on a predetermined word line in response thereto;
   a word driver predecoder which receives a second portion of the row address and generates a sub-row activation signal in response thereto;
   a sub-word line driver which generates a sub-word line activation signal on an output node, said sub-word line driver comprising,
      a pull-down transistor which electrically connects said output node to a ground terminal in response to an inverse of said sub-row activation signal,
      a pull-up transistor which transfers said sub-row activation signal to said output node in response to said main word line activation signal, and
      a driving transistor which transfers said main word line activation signal to said output node in response to said sub-row activation signal; and
   a sub-word line which electrically connects said output node and a predetermined memory cell so that said predetermined memory cell is activated in response to said sub-word line activation signal.

2. An integrated circuit memory device according to claim 1 further comprising a precharge transistor which transfers said main word line activation signal to a gate of said pull-up transistor in response to a predetermined boost voltage.

3. An integrated circuit memory device according to claim 2 wherein said predetermined boost voltage is higher than an internal supply voltage.

4. An integrated circuit memory device according to claim 2 wherein each of said pull-down transistor, said pull-up transistor, said precharge transistor, and said driving transistor comprises an NMOS transistor.

5. An integrated circuit memory device according to claim 4:
   wherein said precharge transistor comprises a drain electrically connected to said predetermined word line, a source electrically connected to said gate of said pull-up transistor, and a gate which is driven by said predetermined boost voltage;
   wherein said pull-up transistor comprises a drain which receives said sub-row activation signal, a source electrically connected to said output node, and said gate electrically connected to said source of said precharge transistor;
   wherein said pull-down transistor comprises a drain electrically connected to said output node, a source electrically connected to a ground terminal, and a gate which receives said inverse of said sub-row activation signal; and
   wherein said driving transistor comprises a drain electrically connected to said predetermined word line, a source electrically connected to said output node, and a gate which receives said sub-row activation signal.

6. An integrated circuit memory device according to claim 1 wherein said sub-word line electrically connects said output node and a second predetermined memory cell so that said first and second predetermined memory cells are activated in response to said sub-word line activation signal.

7. An integrated circuit memory device according to claim 1 wherein said word driver predecoder generates first and second sub-row activation signals in response to said second portion of said row address, said integrated circuit memory device further comprising:
   a second sub-word line driver which generates a second sub-word line activation signal on a second output node, said second sub-word line driver comprising,
      a second pull-down transistor which electrically connects said second output node to a ground terminal in response to an inverse of said second sub-row activation signal,
      a second pull-up transistor which transfers said second sub-row activation signal to said second output node in response to said main word line activation signal, and
      a second driving transistor which transfers said main word line activation signal to said second output node in response to said second sub-row activation signal; and
   a second sub-word line which electrically connects said second output node and a second predetermined memory cell so that said second predetermined memory cell is activated in response to said second sub-word line activation signal.

8. A method of generating a sub-word line activation signal for an integrated circuit memory device having an array of memory cells arranged into rows and columns, a main word line decoder which receives a first portion of a row address and generates a main word line activation signal on a predetermined word line in response thereto, and a word driver predecoder which receives a second portion of the row address and generates a sub-row activation signal in response thereto;

electrically connecting an activation node of a predetermined memory cell to a ground terminal in response to an inverse of the sub-row activation signal;

transferring the sub-row activation signal to said activation node in response to the main word line activation signal; and transferring the main word line activation signal to said activation node in response to the sub-row activation signal so that said predetermined memory cell is activated in response to said sub-word line activation signal.

9. A method according to claim 8 wherein said activation node is shared with a second predetermined memory cell so that said first and second predetermined memory cells are activated in response to said sub-word line activation signal.

10. A method according to claim 8 wherein the word driver predecoder generates first and second sub-row activation signals in response to the second portion of the row address, said method further comprising the steps of:

electrically connecting a second activation node of a second predetermined memory cell to a ground terminal in response to an inverse of the second sub-row activation signal;

transferring the second sub-row activation signal to said second activation node in response to the main word line activation signal; and transferring the main word line activation signal to said second activation node in response to the second sub-row activation signal so that said second predetermined memory cell is activated in response to said second sub-word line activation signal.

11. A sub-word line driver for an integrated circuit memory device having an array of memory cells arranged into rows and columns, a main word line decoder which receives a first portion of a row address and generates a main word line activation signal on a predetermined word line in response thereto, and a word driver predecoder which receives a second portion of the row address and generates a sub-row activation signal in response thereto, said sub-word line driver comprising:

a precharge transistor which transfers the main word line activation signal from a drain to a source thereof in response to a predetermined boost voltage;

a pull-up transistor which transfers the sub-row activation signal from a drain to a source thereof in response to the main word line activation signal transferred by said precharge transistor;

a pull-down transistor having a drain connected to said source of said pull-up transistor and having a source connected to a ground terminal, wherein said pull-down transistor electrically connects said source of said pull-up transistor and said ground terminal in response to an inverse of the sub-row activation signal; and a driving transistor which transfers the main row activation signal to the source of said pull-up transistor in response to the sub-row activation signal.

12. A sub-word line driver according to claim 11 wherein said predetermined boost voltage is higher than an internal supply voltage.

13. A sub-word line driver according to claim 11 wherein each of said precharge transistor, said pull-up transistor, said pull-down transistor, and said driving transistor comprises an NMOS transistor.

14. A sub-word line driver according to claim 11 wherein said word driver predecoder generates a second sub-row activation signal, said sub-word line driver further comprising:

a second precharge transistor which transfers the main word line activation signal from a drain to a source thereof in response to said predetermined boost voltage;

a second pull-up transistor which transfers the second sub-row activation signal from a drain to a source thereof in response to the main word line activation signal transferred by said second precharge transistor;

a second pull-down transistor having a drain connected to said source of said second pull-up transistor and having a source connected to a ground terminal, wherein said second pull-down transistor electrically connects said source of said second pull-up transistor and said ground terminal in response to an inverse of the second sub-row activation signal; and a second driving transistor which transfers the main row activation signal to the source of said second pull-up transistor in response to the second sub-row activation signal.

15. A sub-word line driver for an integrated circuit memory device having an array of memory cells arranged into rows and columns, a main word line decoder which receives a first portion of a row address and generates a main word line activation signal on a predetermined word line in response thereto, and a word driver predecoder which receives a second portion of the row address and generates a sub-row activation signal in response thereto, said sub-word line driver comprising:

a pull-down transistor having a drain connected to a sub-word line and a source connected to a ground terminal, wherein said pull-down transistor electrically connects said sub-word line and said ground terminal in response to an inverse of the sub-row activation signal;

a precharge transistor which transfers the main word line activation signal from a drain to a source thereof in response to a predetermined boost voltage;

a pull-up transistor which transfers the sub-row activation signal to a said sub-word line in response to the main word line activation signal transferred by said precharge transistor; and a driving transistor which transfers the main row activation signal to said sub-word line in response to the sub-row activation signal.

16. A sub-word line driver according to claim 15 wherein the word driver predecoder generates a second sub-row activation signal, said sub-word line driver further comprising:

a second pull-down transistor having a drain connected to a second sub-word line and a source connected to a ground terminal, wherein said second pull-down transistor electrically connects said second sub-word line and said ground terminal in response to an inverse of the second sub-row activation signal;

a second precharge transistor which transfers the main word line activation signal from a drain to a source thereof in response to a predetermined boost voltage;

a second pull-up transistor which transfers the second sub-row activation signal to a said second sub-word line in response to the main word line activation signal transferred by said second precharge transistor; and a second driving transistor which transfers the main row activation signal to said second sub-word line in response to the second sub-row activation signal.

17. A sub-word line driver according to claim 15 wherein said each of said pull-down transistor, said pull-up transistor, and said driving transistor comprises an NMOS transistor.

18. An integrated circuit memory device comprising:

an array of memory cells arranged into rows and columns;

a main word line decoder which receives a first portion of a row address and generates a main word line activation signal on a predetermined word line in response thereto;

a word driver predecoder which receives a second portion of the row address and generates a sub-row activation signal in response thereto;

a sub-word line driver which generates a sub-word line activation signal on an output node, said sub-word line driver comprising,
- a pull-down transistor which electrically connects said output node to a ground terminal in response to an inverse of said sub-row activation signal, and
- a pull-up transistor which transfers said sub-row activation signal to said output node in response to said main word line activation signal; and a sub-word line which electrically connects said output node and a predetermined memory cell so that said predetermined memory cell is activated in response to said sub-word line activation signal;

wherein each of said pull-down transistor, and said pull-up transistor comprises an NMOS transistor.

19. An integrated circuit memory device according to claim 18:

wherein said precharge transistor comprises a drain electrically connected to said predetermined word line, a source electrically connected to said gate of said pull-up transistor, and a gate which is driven by said predetermined boost voltage;

wherein said pull-up transistor comprises a drain which receives said sub-row activation signal, a source electrically connected to said output node, and said gate electrically connected to said source of said precharge transistor; and wherein said pull-down transistor comprises a drain electrically connected to said output node, a source electrically connected to a ground terminal, and a gate which receives said inverse of said sub-row activation signal.

20. An integrated circuit memory device according to claim 18 wherein said sub-word line electrically connects said output node and a second predetermined memory cell so that said first and second predetermined memory cells are activated in response to said sub-word line activation signal.

21. An integrated circuit memory device according to claim 18 further comprising a precharge transistor which transfers said main word line activation signal to a gate of said pull-up transistor in response to a predetermined boost voltage.

22. An integrated circuit memory device according to claim 21 wherein said predetermined boost voltage is higher than an internal supply voltage.

* * * * *